(12) United States Patent
Forrest et al.

(10) Patent No.: US 6,895,667 B2
(45) Date of Patent: May 24, 2005

(54) TRANSFER OF PATTERNED METAL BY COLD-WELDING

(75) Inventors: Stephen R. Forrest, Princeton, NJ (US); Changsoon Kim, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 435 days.

(21) Appl. No.: 09/833,695

(22) Filed: Apr. 13, 2001

(65) Prior Publication Data

US 2002/0148113 A1 Oct. 17, 2002

(51) Int. Cl.[7] .............................................. H05K 3/02
(52) U.S. Cl. ............................ 29/847; 29/846; 257/79; 257/88; 438/22; 438/23
(58) Field of Search ..................... 29/847, 846; 257/79, 257/88; 438/22, 23

(56) References Cited

U.S. PATENT DOCUMENTS

| | | | |
|---|---|---|---|
| 5,641,611 A | 6/1997 | Shieh et al. | |
| 5,707,745 A | 1/1998 | Forrest et al. | |
| 5,900,160 A | * 5/1999 | Whitesides et al. | 216/41 |
| 5,925,259 A | * 7/1999 | Biebuyck et al. | 216/2 |
| 5,998,803 A | 12/1999 | Forrest et al. | |
| 6,013,538 A | 1/2000 | Burrows et al. | |
| 6,027,630 A | 2/2000 | Cohen | |
| 6,214,631 B1 | 4/2001 | Burrows et al. | |
| 6,294,398 B1 | * 9/2001 | Kim et al. | 438/22 |

FOREIGN PATENT DOCUMENTS

| | | |
|---|---|---|
| WO | 96/19792 | 6/1996 |
| WO | 98/28946 | 7/1998 |

OTHER PUBLICATIONS

Kim et al., "Micropatterning of Organic Electronic Devices by Cold–Welding", *Science*, vol. 288, pp. 831–833, May 5, 2000.

Stutzmann, et al., "Patterning of polymer–supported metal films by microcutting", *Nature*, vol. 407, pp. 613–616, Oct. 5, 2000.

P.W.M. Blom et al., "Efficiency and stability of polymer light–emitting diodes", *Journals of Materials Science Materials in Electronics*, vol. 11, No. 2, Mar. 2000, pp. 105–109.

Y. Xia, et al., *Unconventional Methods for Fabricating and Patterning Nanostructures*, Chem. Rev. 99:7, pp. 1823–1848 (1999).

* cited by examiner

*Primary Examiner*—Carl J. Arbes
*Assistant Examiner*—Tim Phan
(74) *Attorney, Agent, or Firm*—Kenyon & Kenyon

(57) ABSTRACT

Methods for patterning a metal over a substrate and devices formed using the methods are disclosed. A patterned die having at least one raised portion and having a metal layer over the die is pressed onto a thin metal film over a substrate, such that the metal layer over the raised portion of the patterned die contacts portions of the thin metal film. Pressure is then applied such that the metal layer and the thin metal film cold-weld to one another. The patterned die is removed, such that the portions of the metal layer cold-welded to the thin metal film break away from the die and remain cold-welded to the thin metal film over the substrate, in substantially the same pattern as the patterned die.

66 Claims, 17 Drawing Sheets

Figure 3
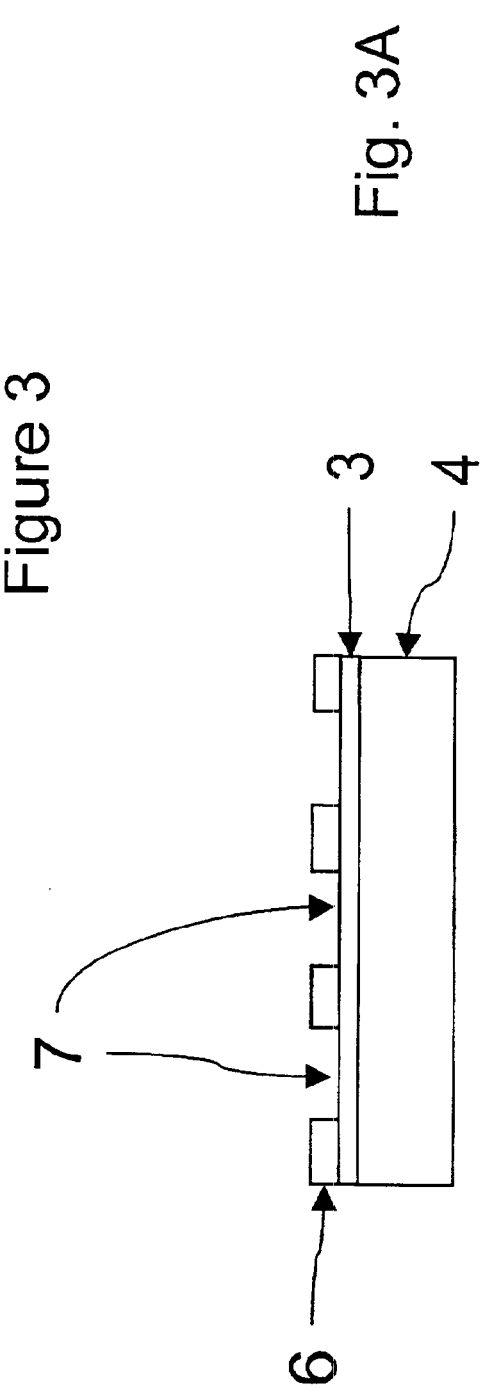
Fig. 3A
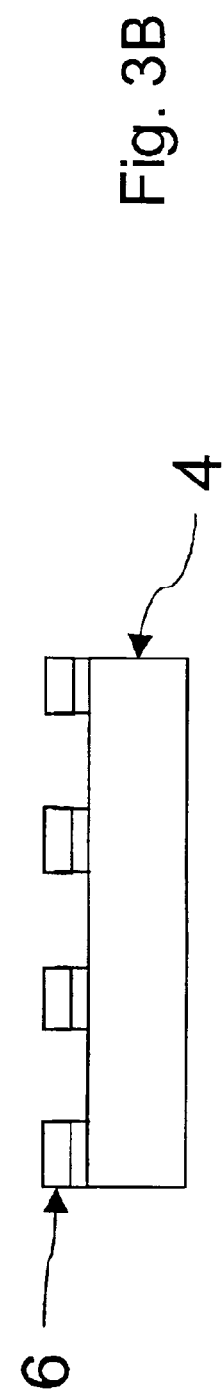
Fig. 3B

Figure 4
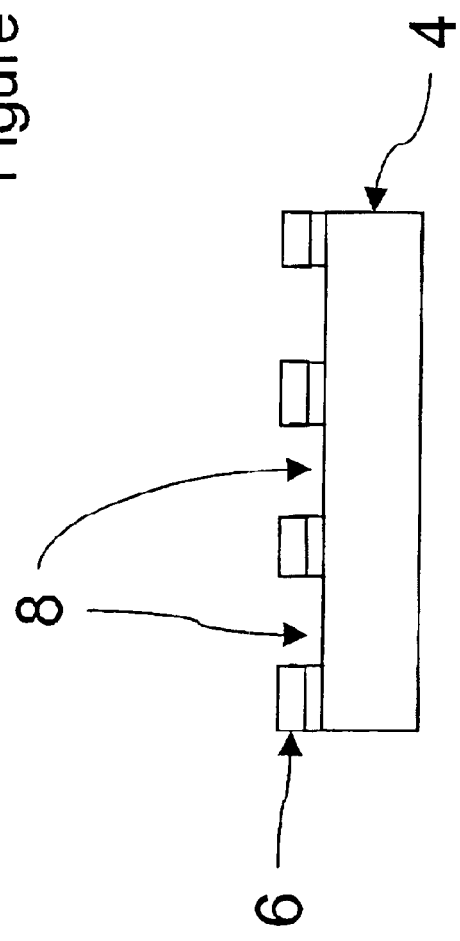
Fig. 4A
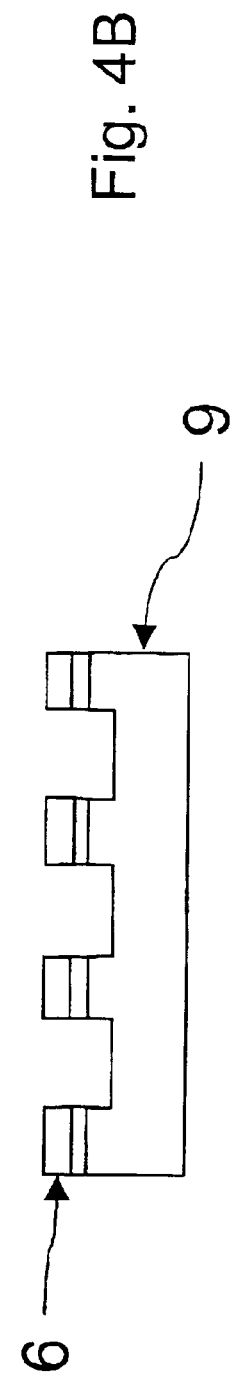
Fig. 4B

Figure 5
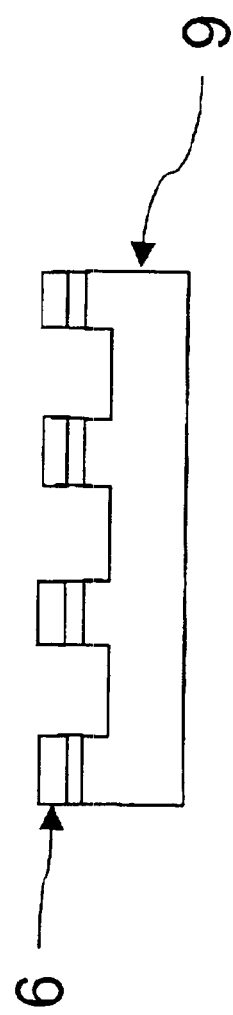
Fig. 5A
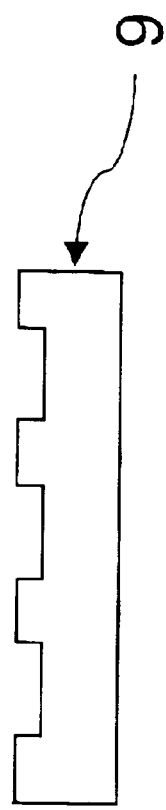
Fig. 5B

Figure 8
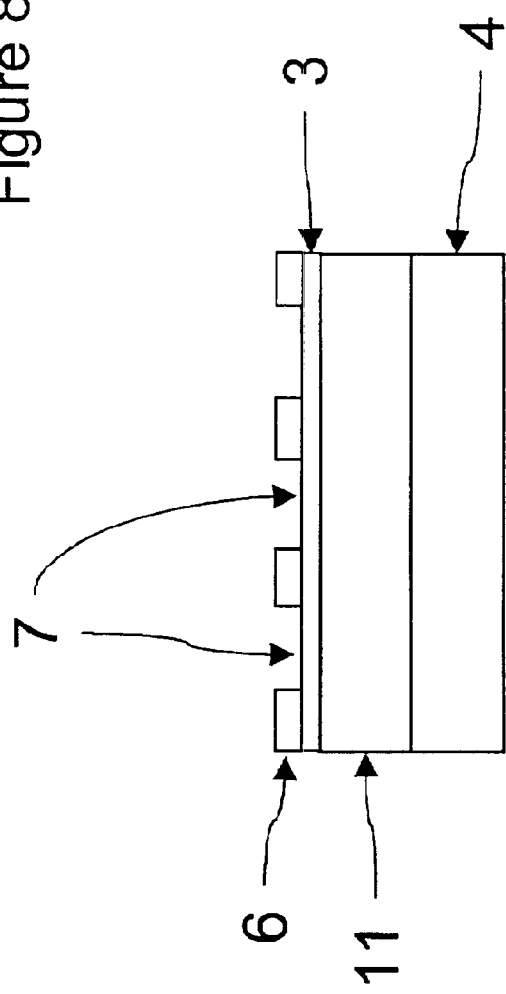
Fig. 8A
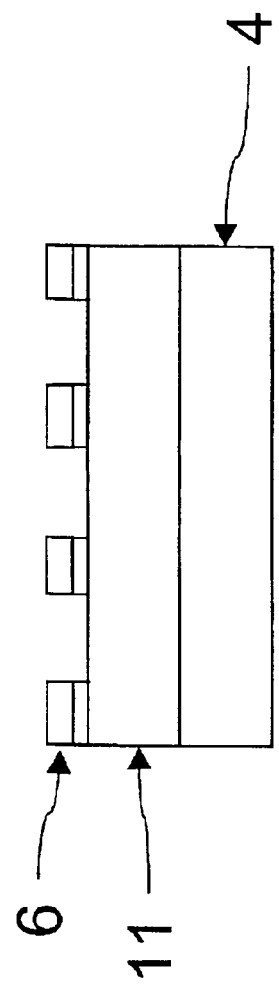
Fig. 8B

Figure 9
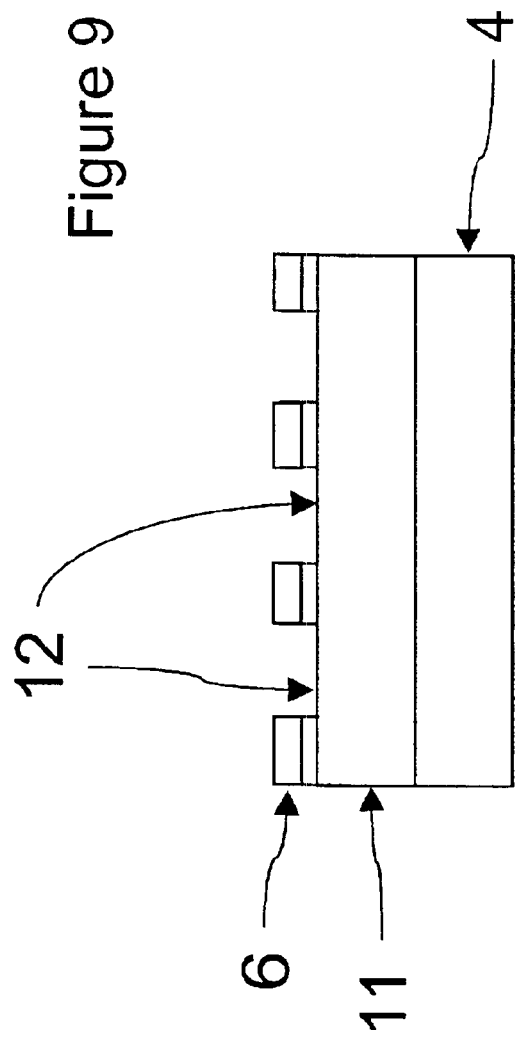
Fig. 9A
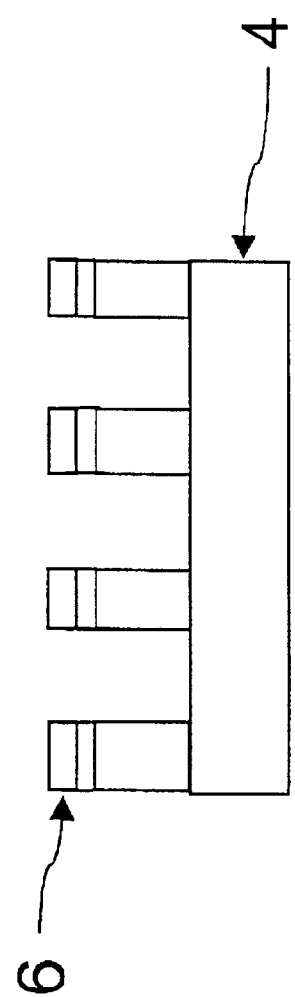
Fig. 9B

Figure 10
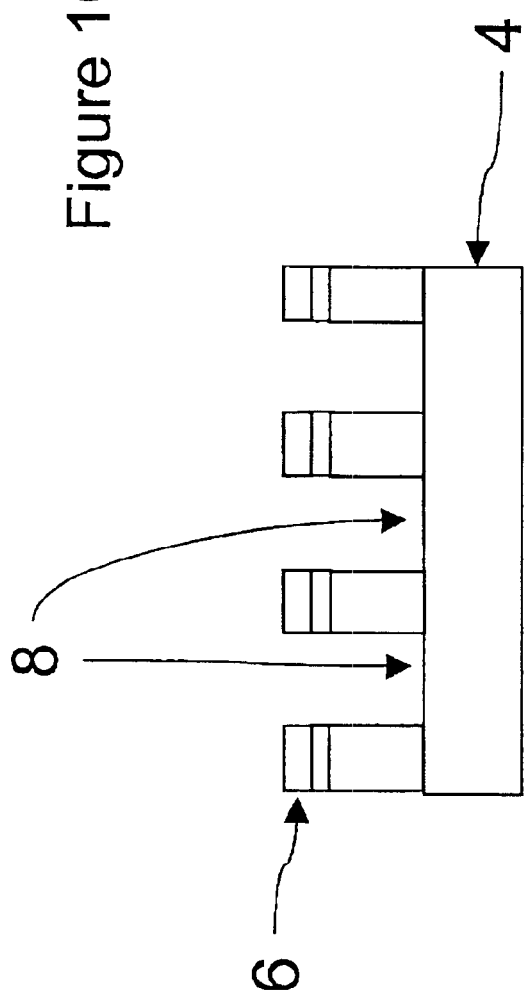
Fig. 10A
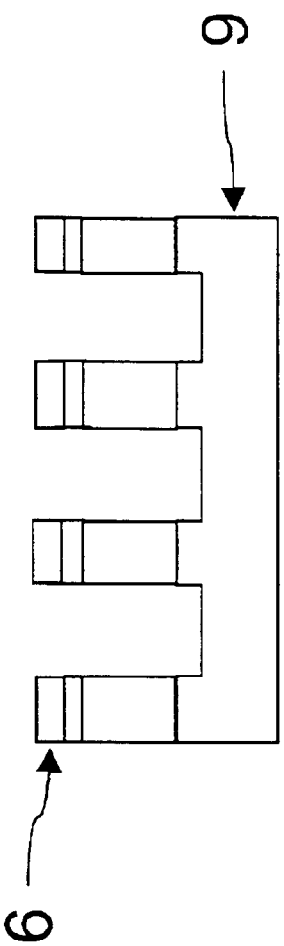
Fig. 10B

Figure 11
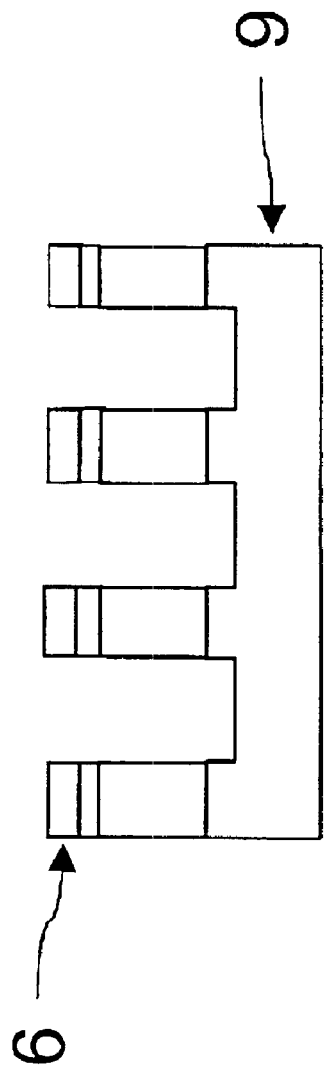
Fig. 11A
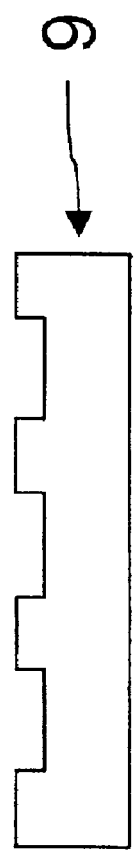
Fig. 11B

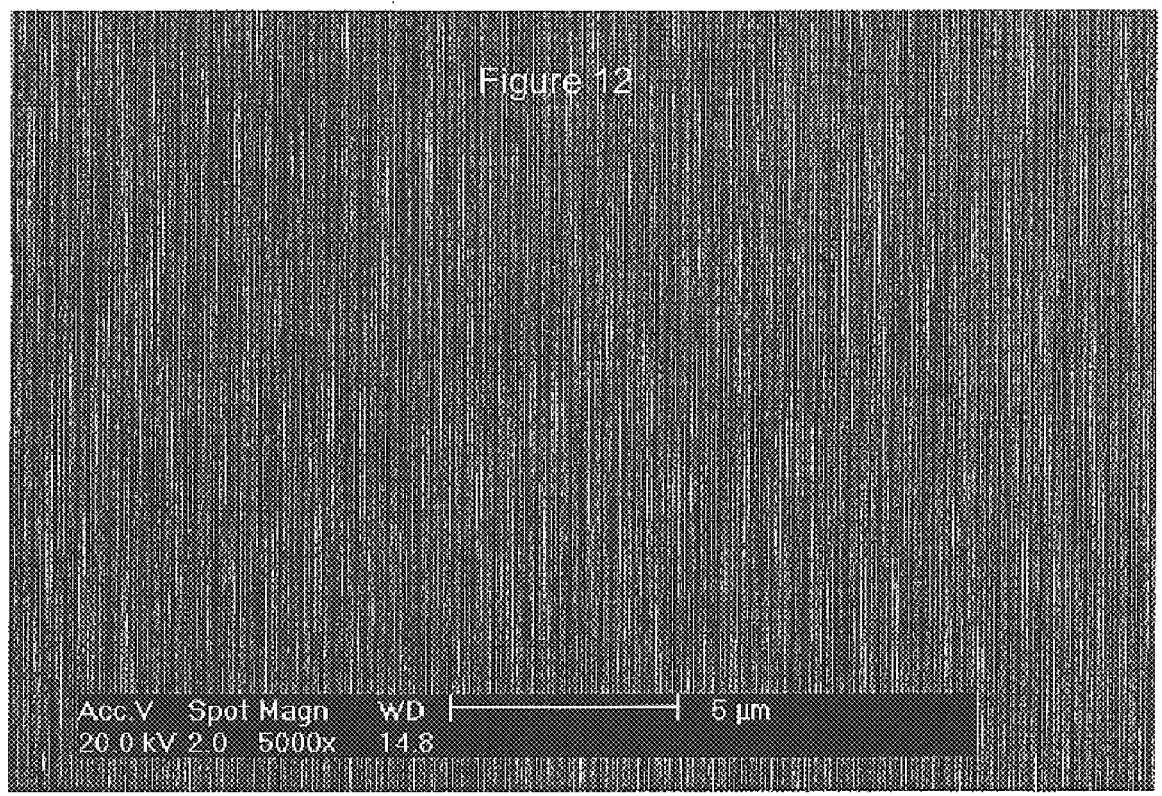

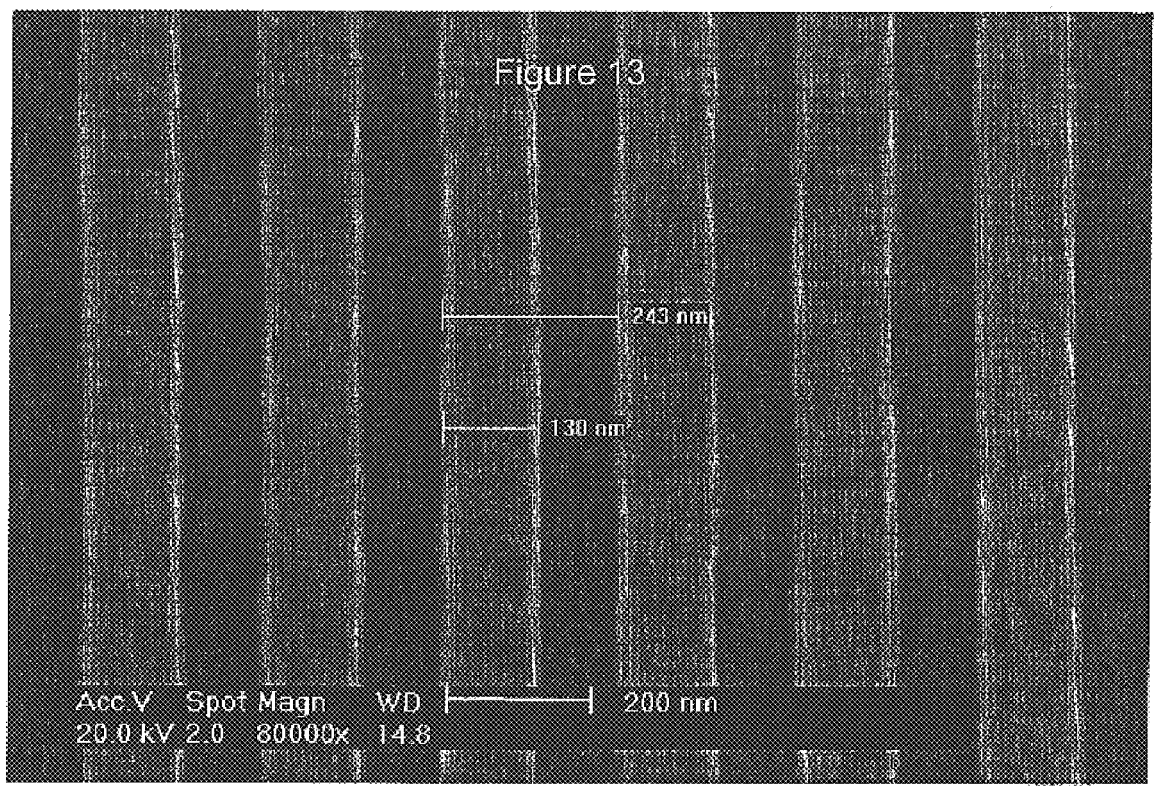

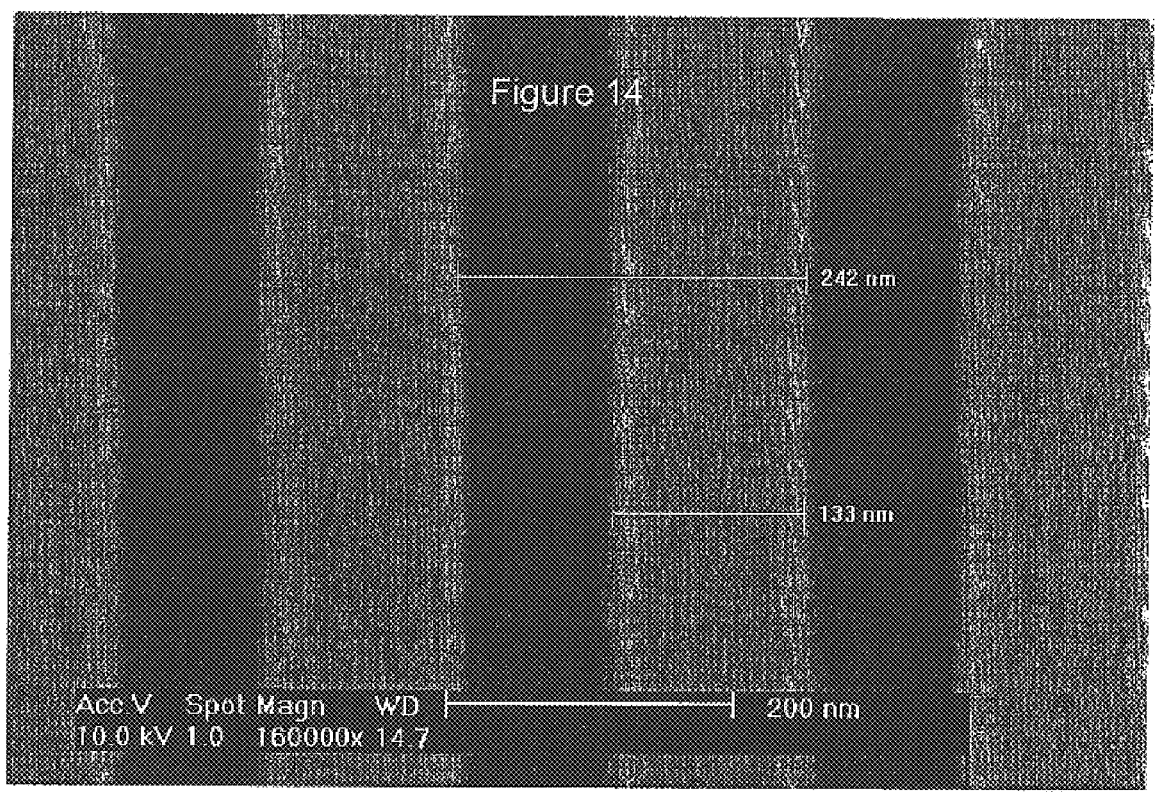

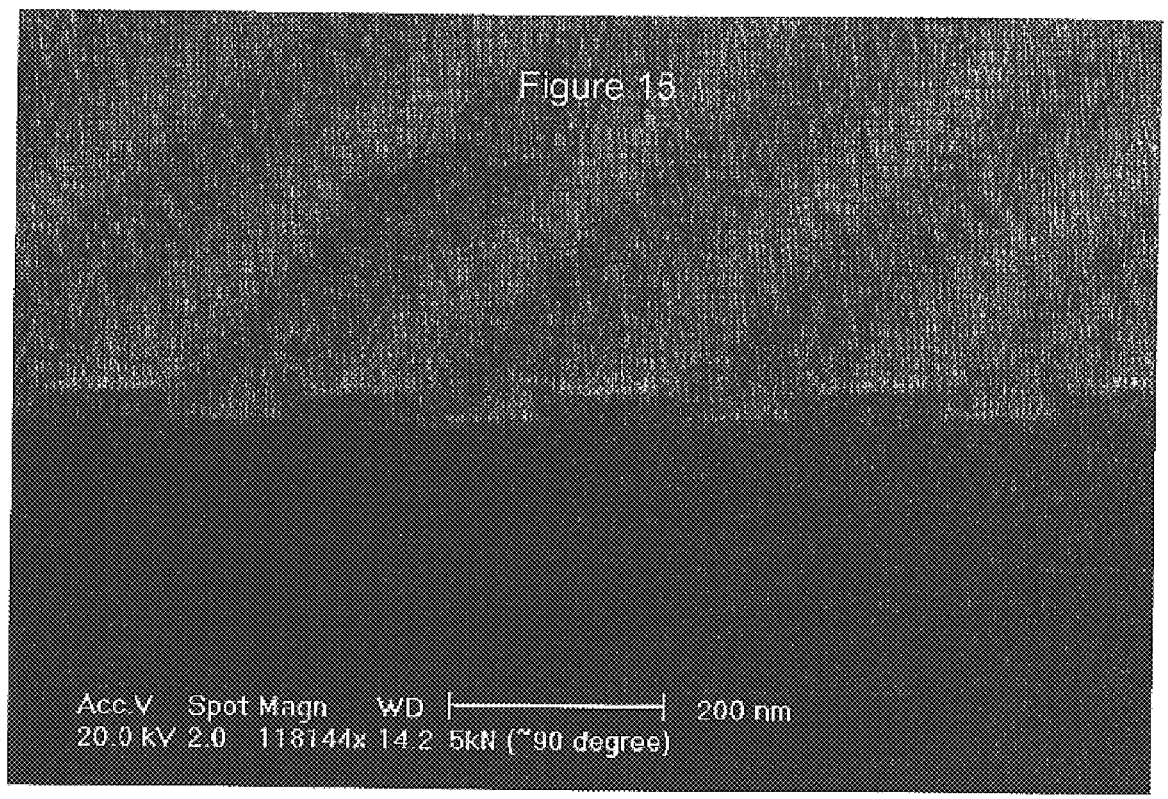

US 6,895,667 B2

TRANSFER OF PATTERNED METAL BY COLD-WELDING

FIELD OF THE INVENTION

The present invention relates to patterning methods for metal, and more particularly to patterning methods using a die. The present invention further relates to devices formed using such methods.

BACKGROUND OF THE INVENTION

Nearly all electronic and optical devices require patterning. Patterned metals are used in forming a variety of such devices. For example, patterned metals may be used in forming in transistors, as electrodes in various devices, and as shadow masks in the patterning of various materials.

One possible use for patterned metals is as electrodes in organic light emitting devices (OLEDs), which make use of thin films that emit light when excited by electric current. Popular OLED configurations include double heterostructure, single heterostructure, and single layer, and may be stacked, as described in U.S. Pat. No. 5,707,745, which is incorporated herein by reference in its entirety.

Patterned metals may be achieved by photoresist methods, as disclosed by U.S. Pat. No. 5,641,611 to Shieh, and in U.S. Pat. No. 6,013,538 to Burrows et al. Shadow masks may also be used to pattern various materials, as described in U.S. patent application Ser. No. 09/182,636. Shadow masks must be thick enough to provide mechanical strength and thus, the obtainable resolution of the pattern is limited. Other methods of patterning have been used, such as excimer laser ablation and conformal masks.

While these known patterning methods are acceptable in certain circumstances, as the patterning dimension decreases, the cost generally increases. Therefore, a more accurate, faster and less expensive method of patterning is desirable.

SUMMARY OF THE INVENTION

The present invention relates to patterning methods for patterning metal over a substrate, and more particularly to patterning methods using a die.

In the methods of the present invention a metal layer is deposited over a patterned die having at least one raised portion. A thin metal film is deposited over a substrate. The die is then pressed onto the substrate, such that the metal layer over the patterned die contacts portions of the thin metal film over the substrate. Sufficient pressure is applied to cold-weld the metal layer and the thin metal film to one another. The patterned die is removed and the portions of the metal layer that are cold-welded to the thin metal film break away from the die and remain cold-welded to the thin metal film over the substrate, in substantially the same pattern as the patterned die.

In one embodiment of the invention, at least one layer is deposited between the substrate and the thin metal film. This layer may be for example, at least one organic layer or a layer suitable in the formation of thin film transistors (TFTs). In one embodiment, the at least one layer includes an adhesion-enhancing layer, which serves to increase the adhesion between the substrate and the thin metal film.

In another embodiment of the invention, an adhesion-diminishing layer is positioned between the patterned die and the metal layer, to lower the adhesion between the metal layer and the die. The adhesion-diminishing layer may comprise for example an organic layer, a TEFLON layer or any other material that may reduce the adhesion between the die and the metal layer thereover, by being positioned between the die and the metal layer.

In another embodiment of the present invention the metal layer over the die includes a double metal layer, that is, two layers of metal over the die.

The present invention further relates to devices formed using the methods described herein, such as devices actually containing metal layers patterned by the above methods, or devices in which patterned metal layers using the above methods were used in the fabrication thereof, for example as a mask layer.

BRIEF DESCRIPTION OF THE DRAWINGS

FIG. 3 shows a cross-section of the substrate of FIG. 2 having the patterned metal thereover, before (FIG. 3A) and after (FIG. 3B) portions of a thin metal film are removed in accordance with one embodiment of the present invention.

FIG. 4 shows a cross-section of the substrate of FIG. 3B having the patterned metal thereover, before (FIG. 4A) and after (FIG. 4B) portions of the substrate are etched to form a patterned substrate having essentially the same pattern as the die in accordance with another embodiment of the present invention.

FIG. 5 shows a cross-section of the substrate of FIG. 4B having the patterned metal thereover, before (FIG. 5A) and after (FIG. 5B) the remaining thin metal film and patterned metal layer are removed from the patterned substrate.

FIG. 8 shows a cross-section of the substrate of FIG. 7 having the patterned metal thereover, before (FIG. 8A) and after (FIG. 8B) portions of a thin metal film are removed in accordance with one embodiment of the present invention.

FIG. 9 shows a cross-section of the substrate of FIG. 8B having the patterned metal thereover, before (FIG. 9A) and after (FIG. 9B) portions of the organic layer are removed in accordance with another embodiment of the present invention.

FIG. 10 shows a cross-section of the substrate of FIG. 9B having the patterned metal thereover, before (FIG. 10A) and after (FIG. 10B) portions of the substrate are etched to form a patterned substrate having essentially the same pattern as the die, in accordance with a further embodiment of the present invention.

FIG. 11 shows a cross-section of the substrate of FIG. 10B having the patterned metal thereover, before (FIG. 11A) and after (FIG. 11B) the remaining thin metal film and patterned metal layer are removed from the patterned substrate.

FIG. 12 shows SEM images of a sample of patterned metal formed by a method according to the present invention.

FIG. 13 shows a magnified image of the sample of patterned metal of FIG. 12 having a metal line width of about 130 nm.

FIG. 14 shows a further magnified image of the sample of patterned metal of FIG. 12 having a metal line width of about 130 nm.

FIG. 15 shows SEM images of the sample of patterned metal of FIG. 12, at about a 90 degree angle.

DETAILED DESCRIPTION

The present invention will now be described in detail for specific preferred embodiments of the invention, it being understood that these embodiments are intended only as illustrative examples and the invention is not to be limited thereto.

A method is provided for forming a patterned metal layer over a substrate using a die. Such a patterned metal layer may be used for example, in forming an electronic device, either as part of the device itself or as a mask in patterning other layers of the device or the substrate.

Prior to patterning in accordance with the present invention, a thin metal film is deposited over a substrate using techniques known to the art. Substrates in accordance with the present invention may be made of any suitable material, including for example, glass, polymers, silicon and plexiglass. The substrate may be rigid, non-rigid, flexible, opaque or transparent. Preferably, the substrate is made of an essentially transparent material such as glass or plastic. Preferably, the substrate is made of a rigid material or is supported by a rigid material to avoid movement of the substrate when a die is pressed against the substrate.

Figure 17:
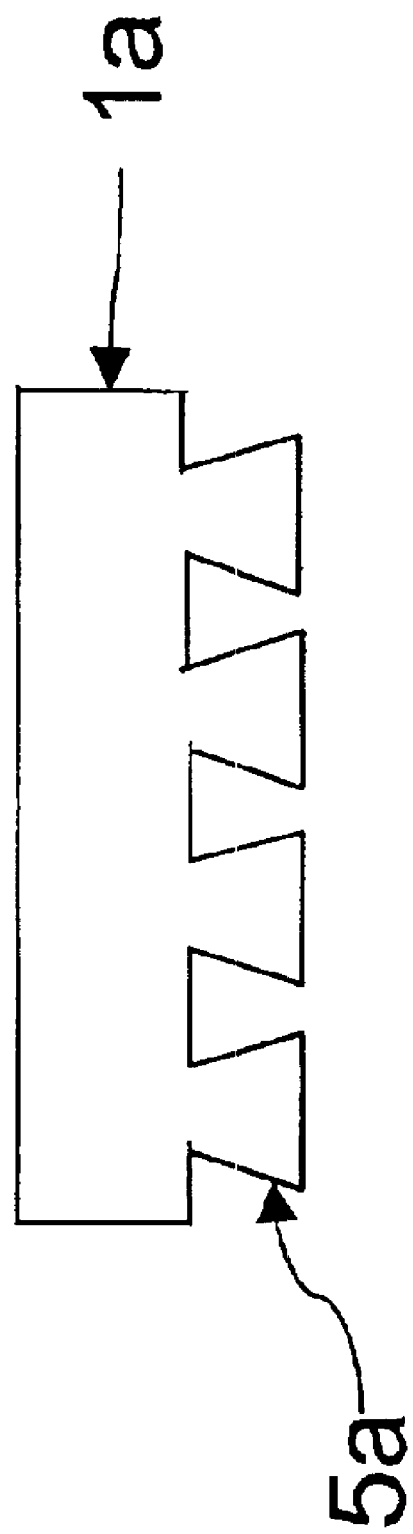
FIG. 17 shows the most preferred shape for the die of the present invention to avoid side wall deposition of metal on the die.

Also prior to patterning, a metal layer is deposited over a patterned die having at least one raised portion such that the metal layer is deposited at least over the raised portions of the die. The die has raised and depressed portions that form a desired pattern. The die may be patterned by any method known in the art, such as by lithography and reactive ion etching. The die preferably has sharp edges to avoid side wall deposition of metal on the die. Additionally, the shape of the die may help avoid side wall deposition of a metal on the die. The most preferred shape for the die is depicted in FIG. 17.

The die used in accordance with the present invention is preferably formed from a hard substance. Preferably, the die is made of a substance that is readily patterned. Examples of suitable materials that may be used to form dies in accordance with the present invention include silicon, glass, quartz, steel and hard metals. Silicon is a preferred die material in the laboratory, because it is hard and readily patterned. However, different materials may be more suitable for large scale production. The patterning may be achieved by methods known in the art based on the composition of the die. One example of a suitable patterning technique when the die is made of silicon is lithography using a phase mask and reactive ion etching.

The metal layer over the die comprises a metal that is capable of cold-welding to the thin metal film over the substrate on compression of the metal layer to the thin metal film. Suitable metals for use as the thin metal film and metal layer include those known to those skilled in the art as being capable of cold-welding to one another. Preferably, the metal layer and the thin metal film are made of non-reactive metals, such as silver and gold that do not form an oxide layer. The metal layer and the thin metal film may be made of the same metal or different metals and preferably form a strong cold-welded bond with one another when pressure is applied. For example, if the metal layer is made of gold, the thin metal film may be made of gold or silver; and if the metal layer is made of silver, the thin metal film may be made of gold or silver.

The metal layer over the die may include two or more metal layers, so long as the metal layer that contacts the thin metal film on compression, is capable of cold-welding to the thin metal film. Any additional metal layers over the die that do not come into contact with the thin metal film, are not limited to materials that are capable of cold-welding to another material. Accordingly, metals such as chromium and aluminum may be used as one of two or more metal layers that make up the metal layer over a die, even though such metals may not be ideal as the metal layer that comes into contact with the thin metal film.

Embodiments including at least two layers of metal over the die may be preferred for example, when the patterned metal layer over the stamp is being used as an etching mask, depending on the selectivity of an etching process. The additional metal layers may be advantageous when the patterned metal layer(s) is transferred to a substrate by the processes described herein, and layers under the patterned metal layer(s) are being etched, to prevent all of the patterned metal layer from being etched away prior to the completion of desired etching of any layers under the patterned metal layer(s). The etch rate depends on the material being etched and the process by which it is being etched. Therefore, it may be desirable to have as a second metal layer over a die (which is transferred to the substrate by the present processes), a metal that has a slower etch rate than the first metal layer and/or the material that will be etched using the metal(s) as a mask.

The thin metal layer is deposited over the substrate by methods known in the art. For example thermal evaporation is an example of a form of deposition that may be suitable for depositing a thin film of gold over the substrate. The thin metal layer may be from about 25 Å to about 100 Å thick, preferably about 50 Å thick, depending on the composition of the thin metal film.

The metal layer deposited over the die is deposited by methods known in the art. For example e-beam evaporation is an example of a form of deposition that may be suitable for depositing gold over the substrate. The metal layer over the die may be from about 100 Å to about 300 Å thick, preferably about 100 Å thick, depending on the composition of the metal layer.

In the methods of the present invention, the die and the substrate are pressed (or "stamped") against one another such that the portions of the metal layer over the raised portions of the patterned die contact portions of the thin metal film over the substrate. Sufficient pressure is applied to the die and/or the substrate, such that the portions of the metal layer that contact the thin metal film cold-weld thereto.

As two solid surfaces (e.g., the metal layer over the die and the thin metal layer over the substrate) are brought into contact, they can bond to each other when the interfacial separation is decreased below a critical value, resulting in a single solid. When this happens, the two surfaces are cold-welded to one another. In order to achieve good patterns by this technique, the applied pressure should be high enough to decrease the interfacial separation below the critical value.

The applied pressure should be high enough to decrease the interfacial separation of the thin metal film and metal layers below the critical value. An example of a suitable pressure is about 25 MPa to about 200 MPa, preferably about 50 MPa.

When the die is applied to the thin metal layer, the substrate may bend such that the device bows into depressed portions of the die. Contact between the device and the depressed portion of the die is undesirable, and could lead to contact between the thin metal film and portions of the metal layer that are not on the raised portions of the die, and which are supposed to remain on the die and not be transferred to the thin metal film. To avoid such contact, various parameters may be controlled. For example, stiffer substrates and lower forces applied to the die are two factors that may be used to eliminate such contact. Alternatively, if a flexible substrate is used, the substrate may be mounted on a stiff support structure, if desired. Still other means may be used to keep the flexible substrate sufficiently rigid to maintain the desired tolerances. Another important factor is the geometry of the die. In particular, by increasing the depth of the depressed portions, or by decreasing the separation between the raised portions, such contact may be avoided. It is believed that a depth of about 10 microns per 1 millimeter of separation is preferred to avoid such contact, although this ratio may change depending upon the particular substrate and forces. A die having the shape depicted in FIG. 17 is a preferable shape for dies of the present invention.

The patterned die is then removed and the portions of the metal layer that are cold-welded to the thin metal film break away from the die and remain cold-welded to the thin metal film over the substrate, in substantially the same pattern as the patterned die. To ensure that the cold-welded metal remains over the substrate rather than breaking away from the substrate when the die is removed, the relative adhesion between the die and the metal layer thereover should preferably be smaller than the adhesion between the thin metal film and the substrate it is over.

In one embodiment of the present invention, an adhesion-diminishing layer is positioned between the patterned die and the metal layer, to lower the adhesion between the metal layer and the die. The adhesion-diminishing layer may include for example an organic layer, a TEFLON layer or any other material that may reduce the adhesion between the die and the metal layer thereover, by being positioned between the die and the metal layer. Preferably, the adhesion-diminishing layer should reduce the adhesion between the die and the metal layer thereover a sufficient amount such that the relative adhesion between the die and the metal layer thereover is smaller than the adhesion between the thin metal film and the substrate it is over. Thus, when the die is pulled away from the substrate after the metal layer and thin film metal are cold-welded to one another, the cold-welded metals should remain over the substrate rather than being pulled off with the die.

The composition and/or thickness of the adhesion-diminishing layer is preferably selected to achieve the desired results. Examples of suitable adhesion diminishing layers include thin organic layers and TEFLON. The thin organic layers may be for example, between about 25 and about 100 Å thick, preferably about 50 Å thick. The thin organic layer may optionally be made of Alq3. Alq3 is an electron injection layer. The Alq3, may function as an electron injection/electron transport layer for example, in organic light emitting devices. Alq3 has the following formula.

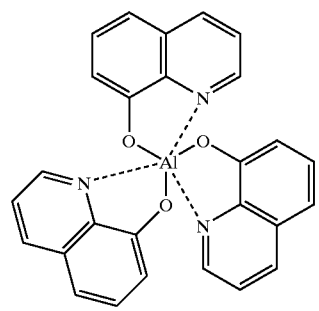

The adhesion-diminishing layer is deposited over the die by methods known in the art. An example of one suitable method of depositing Alq3 for example, is by thermal evaporation.

In another embodiment of the present invention, at least one layer is deposited between the substrate and the thin metal film. The at least one layer may be for example, at least one organic layer, which may be used for example in forming organic light emitting devices. Alternatively, the at least one layer between the substrate and the thin metal film may include a material suitable in the formation of thin film transistors (TFTs), such as CuPc, perylene, pentacene, and other materials known in the art.

According to one embodiment, the at least one layer between the substrate and the thin metal film includes an adhesion-enhancing layer, which increases adhesion between the substrate and the thin metal film. Suitable materials that would perform an adhesion-enhancing function depending on the materials of the substrate and the materials of the thin metal film, would be apparent to those skilled in the art.

The at least one layer between the substrate and the thin metal film may or may not be an organic layer. The at least one layer that is optionally deposited over the substrate between the substrate and the thin metal film, may be deposited by any suitable method known in the art. For example, when the at least one layer is a polymer layer, the polymer layer may be deposited for example, using spin coating.

The thickness of the at least one layer between the substrate and the thin metal film depends on the purpose for which the layer is to be used and the composition of the layer. Suitable thicknesses would be known to those skilled in the art.

Due to the relatively high applied pressure in the present invention to achieve cold-welding of metals, plastic deformation of the organic layers or any other layers between the substrate and the thin metal film should be taken into consideration in deciding what materials to use, the thicknesses of the materials and the amount of pressure applied.

Patterned metal layers over a substrate formed according to the methods of the present invention may be used for example, as an electrode in electrical devices. For example, the patterned metal layer may be used as a cathode layer or an anode layer in organic light emitting devices (OLEDs) or stacked organic light emitting devices (SOLEDs) as described for example in U.S. Pat. No. 5,707,745.

After the patterned metal is transferred over a substrate, other layers over the substrate may be selectively removed based on the purpose of the patterned metal layer. For example, the portions of the thin metal film that are not covered by the patterned metal layer, may be removed by sputtering or other methods known in the art.

In embodiments where an organic layer is positioned between the substrate and the thin metal film, if desired, after the portions of the thin metal film that are not covered by the patterned metal are removed, the portions of the organic layer that are not covered by the patterned metal may be removed by methods known in the art. Portions of the organic layer may be removed for example, by etching. A non-limiting example of a suitable form of etching is plasma etching or reactive ion etching (such as anisotropic etching), for example with $O_2$ or a combination of $CF_4$ and $O_2$ to remove the exposed organic layers, i.e., the parts of the organic layers not covered by the patterned metal layer.

Similarly, in embodiments where an adhesion-enhancing layer is positioned between the substrate and the thin metal, if desired, after portions of the thin metal film that are not covered by the patterned metal are removed, the portions of the adhesion-enhancing layer that are not covered by the patterned metal may be removed by methods known in the art depending on the composition of the adhesion-enhancing layer.

In embodiments where any other layers are positioned between the substrate and the thin metal film, if desired, after the portions of the thin metal film that are not covered are removed, the portions of the layers that are not covered by the patterned metal layer may also be removed by methods known in the art.

Additionally, if desired, according to one embodiment of the invention, portions of all layers over the substrate that are not covered by the patterned metal layer are selectively removed and subsequently the portions of the substrate that are not covered by the metal layers are etched to form a patterned substrate. The form of etching may depend on the composition of the substrate. Suitable forms of etching may include anisotropic etching and other forms of etching known in the art.

According to this embodiment, after the substrate is patterned any portions of layers remaining over the substrate, including the patterned metal layer, may optionally then be removed from the substrate to yield an uncovered patterned substrate. The removal of the remaining portions of layers may be accomplished by any method known in the art. One method is by application of a suitable wet chemical for removing whatever material is being removed.

The methods of the present invention in which a patterned metal layer remains over the substrate, result in a patterned metal layer over a substrate having a resolution of about 30 nm. However, it is contemplated that depending on the quality of the stamp and other factors, the method of the present invention may result a patterned metal layer over a substrate having a higher resolution than 30 nm.

One embodiment of the present invention includes a method of patterning a substrate, which includes depositing an organic layer over a substrate; depositing a thin metal film over the organic layer; pressing a patterned die having at least one raised portion and having a metal layer thereover onto the thin metal film, such that the metal layer over the raised portion of the patterned die contacts portions of the thin metal film over said substrate, and applying sufficient pressure such that the metal layer and the thin metal film cold weld to one another. According to this embodiment, the patterned die is then removed and the metal layer cold-welded to portions of the thin metal film with which it has contact, detaches from the patterned die and remains cold-welded to the thin metal film over the substrate. The metal transferred to the thin metal film forms a patterned metal layer over the substrate in substantially the same pattern as the at least one raised portion of the die. Next, according to the method of this embodiment portions of the thin metal film that are not covered by the patterned metal layer are removed, for example by sputtering. Then, portions of the organic layer that are not covered by the patterned metal layer are removed, for example by etching. The portions of the substrate that are not covered by the patterned metal layer are etched to form a patterned substrate. Lastly, according to this embodiment, the patterned metal layer and the remaining portions of the thin metal film and the organic layer from said patterned substrate are removed to arrive at an uncovered patterned substrate.

The present invention further relates to devices formed using the methods of the present invention. Such devices include devices containing metal layers patterned by the described methods and devices in which patterned metal layers using the described methods were used in the fabrication thereof, for example as a mask layer.

Figure 1:
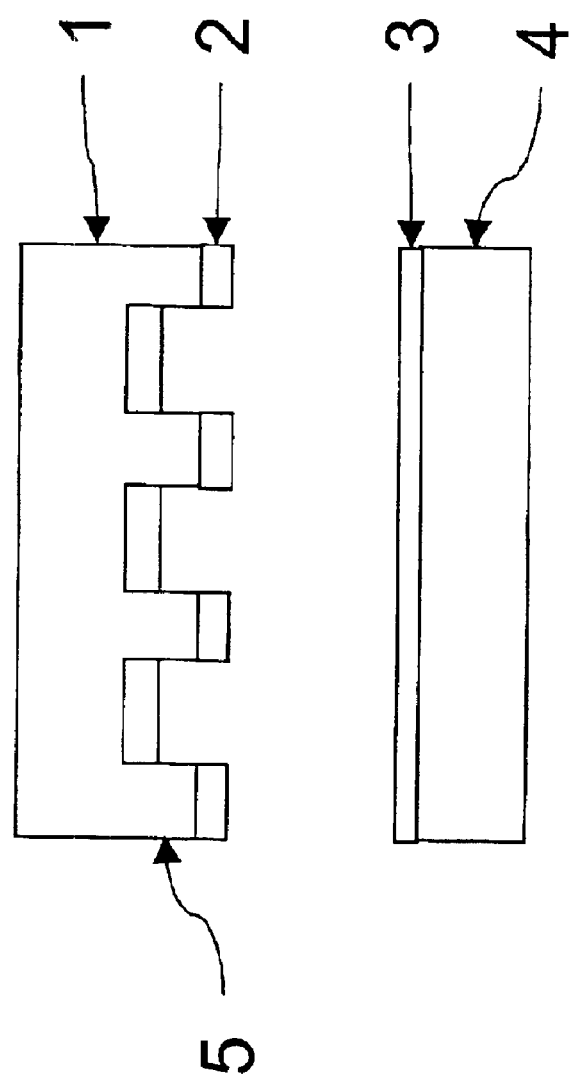
FIG. 1 shows a cross-section of a patterned die adapted for use with the present invention and a substrate, wherein a patterned metal layer will be transferred from the die to the substrate by cold-welding metal over the die to portions of a thin metal film over the substrate.

FIG. 1 shows a cross-section of a die 1 adapted for use with the present invention and a substrate 4 over which a metal material is to be patterned. Die 1 is preferably formed of a hard substance such as silicon. Die 1 has raised portions 5, which may be formed using techniques known in the art, depending on the composition of the die, such as silicon patterning and etching processes. The die 1 has a metal layer 2 deposited over at least the raised portions 5 of the die using techniques known to the art. Alternatively, to using die 1 from FIG. 1, die 1a as depicted in FIG. 17 may be used having raised portions 5a. The shape of die 1a helps avoid side wall deposition of a metal when the metal layer 2 is deposited over the die 1a. Each time "die 1" and "raised portions 5" are referred to in the following description of the figures, it should be understood that die 1a and raised portions 5a may be substituted therefor. It is also to be understood that the die may be other shapes not specifically depicted so long as it is patterned so as to be capable of transferring a patterned metal layer to a substrate.

Substrate 4 has a thin metal film 3 deposited thereover using techniques known to the art. Substrate 4 may be made of any suitable material, including glass, polymers, and plexiglass. Substrate 4 may be rigid, flexible, opaque or transparent. Preferably, substrate 4 is made of a substantially transparent material such as glass or plastic. The metal layer 2 includes a metal that is capable of cold-welding to the thin metal film 3 on compression of the metal layer 2 against the thin metal film 3. Preferably the metal layer 2 and the thin metal film 3 are non-reactive metals, such as silver and gold.

Die 1 is pressed onto the thin metal film 3, and the portions of the metal layer 2 over the raised portions 5 of die 1 contact portions of the thin metal film 3. Sufficient pressure is applied such that the portions that the portions of the metal layer 2 that contact portions of the thin metal film 3 cold-weld thereto.

The die 1 is then removed and the portions of the metal layer 2 that are cold welded to the thin metal layer 3, remain cold welded to the thin metal layer 3 and break away from the die, leaving a patterned metal layer 6 over the substrate.

Figure 2:
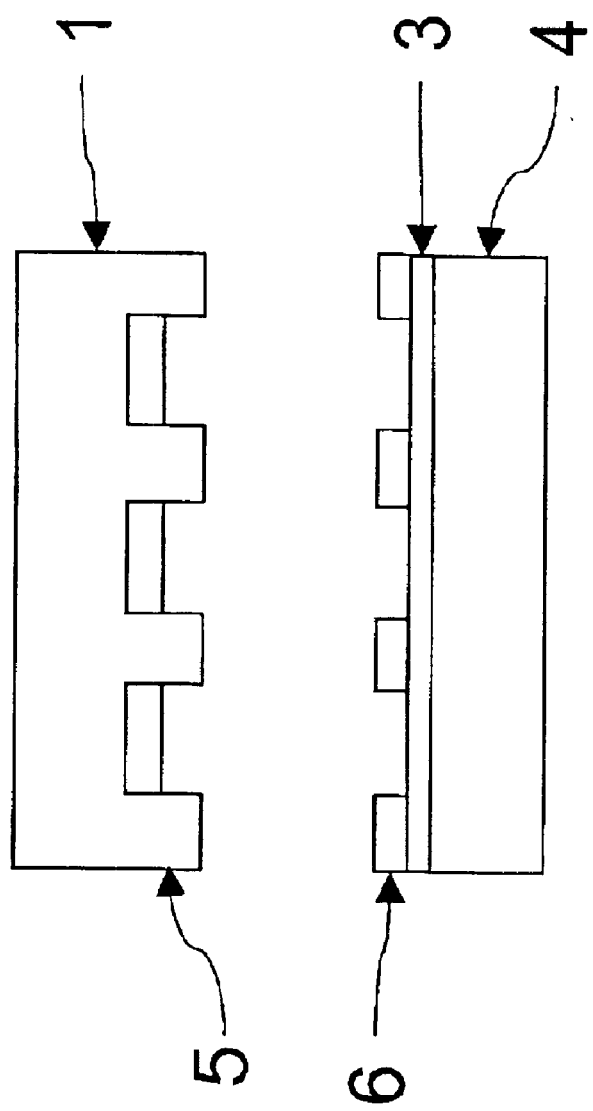
FIG. 2 shows a cross-section of the die and the substrate of FIG. 1 after portions of the metal from the die have been transferred to the substrate in accordance with the method of the present invention.

FIG. 2 shows a cross-section of the die 1 and the substrate 4 of FIG. 1 after portions of the metal from the die have been transferred to the substrate to form a patterned metal layer 6 over the thin metal film 3, in accordance with the methods of the present invention.

FIG. 3A shows a cross-section of the substrate 4 of FIG. 2 having the patterned metal 6 thereover. Depending on the specific type of device being made, it may be desirable to remove the portions of the thin metal film 3 that are not covered 7 by the patterned metal. For example, in order for the substrate to be patterned, the uncovered portions 7 of thin metal film 3 must be removed before one can get to the substrate to etch it. The uncovered portions 7 of the thin metal film 3 may be removed for example, by sputtering to yield a substrate having the patterned metal layer 6 and corresponding portions of a thin metal film thereover, as depicted in FIG. 3B.

FIG. 4A shows a cross-section of the substrate of FIG. 3B having the patterned metal and corresponding patterned thin metal film thereover. According to one embodiment of the present invention, if desired, the substrate may then be patterned, for example, by anisotropic etching the portions of the substrate 8 that are uncovered by the patterned metal, to yield the patterned substrate depicted in FIG. 4B. The pattern of the patterned substrate essentially corresponds to the pattern of the die 1 that was used to transfer the metal over the substrate.

According to a further embodiment of the present invention, if desired, the patterned layers over the patterned substrate as depicted in FIG. 5A may then be removed from the substrate to yield an uncovered patterned substrate 9 as depicted in FIG. 5B. Such layers may be removed for example by use of a suitable wet chemical depending on the composition of the layers that are being removed.

Figure 6:
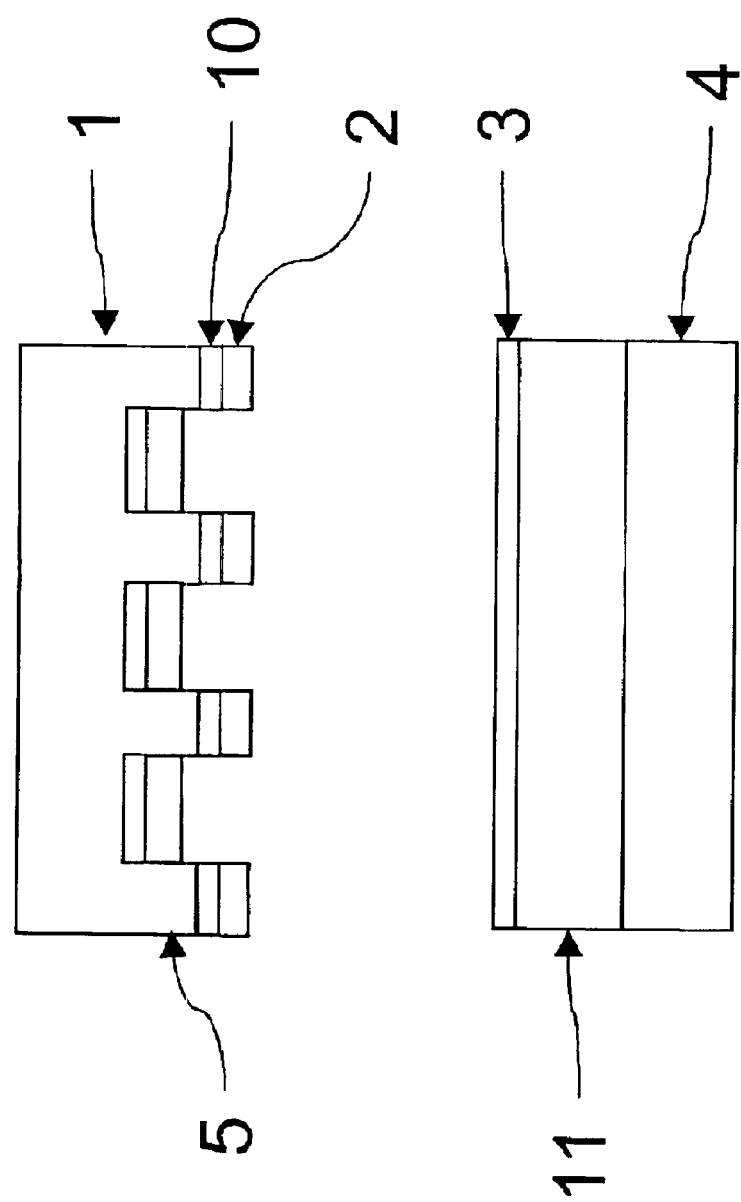
FIG. 6 shows a cross-section of a patterned die adapted for use with the present invention having an adhesion-diminishing layer between the die and the metal layer thereover, and a substrate over which a metal material is to be patterned by cold-welding the metal over the die to the thin metal film over the substrate, in which an organic layer is positioned between the substrate and the thin metal film.

FIG. 6 shows a cross-section of a patterned die 1 adapted for use with the present invention having an adhesion-diminishing layer 10, made of for example, a thin organic layer or TEFLON, between the die 1 and the metal layer 2 thereover. Die 1 has raised portions 5, which may be formed using techniques known in the art, depending on the composition of the die. FIG. 6 also shows a cross-section of a substrate 4 having a thin metal layer 3 over the substrate and a layer 11 positioned between the substrate and the thin metal film. Layer 11 may include be organic or inorganic and may be a single layer or a plurality of layers. For example, layer 11 may include the multiple organic layers of a single or double heterostructure OLED, as described in U.S. Pat. No. 5,707,745, and which is incorporated by reference in its entirety herein. The layer 11 and the thin metal layer 3 are deposited over the substrate 4 using techniques known in the art. The substrate 4 and die 1 may be made of similar materials as those set forth with regard to FIG. 1. The thin metal film 3 and the metal layer 2 may include the metals described with regard to FIG. 1.

Die 1 is pressed onto the thin metal film 3, and the portions of the metal layer 2 over the raised portions 5 of die 1 contact portions of the thin metal film 3. Sufficient pressure is applied such that the portions that the portions of the metal layer 2 that contact portions of the thin metal film 3 cold-weld thereto.

The die 1 is then removed and the portions of the metal layer 2 that are cold welded to the thin metal layer 3, remain cold-welded to the thin metal layer 3 and break away from the die, leaving a patterned metal layer 6 over the substrate.

Figure 7:
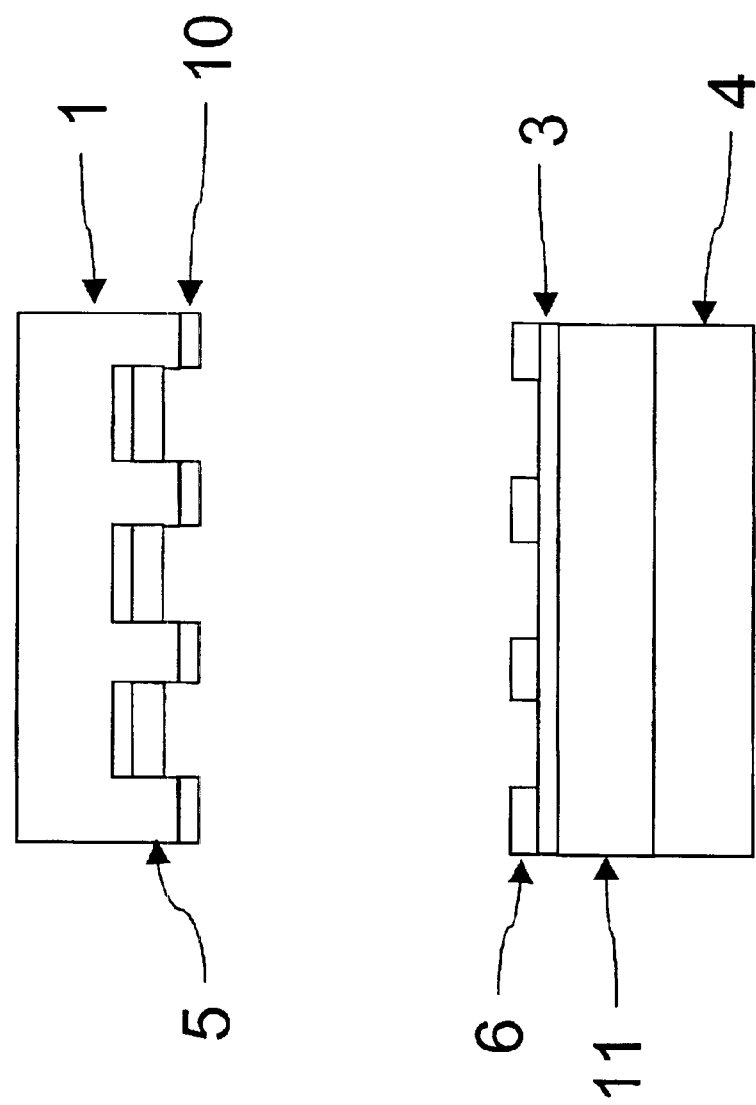
FIG. 7 shows a cross-section of the die and the substrate of FIG. 6 after portions of the metal from the die have been transferred to the substrate in accordance with a method of the present invention to form a patterned metal layer over the substrate, in accordance with an embodiment of the present invention.

FIG. 7 shows a cross-section of the die 1 and the substrate 4 of FIG. 6 after portions of the metal from the die have been transferred to the substrate 4 in accordance with a method of the present invention to form a patterned metal layer 6 over the substrate 4, in accordance with an embodiment of the present invention.

FIG. 8A shows a cross-section of the substrate 4 of FIG. 7 having the patterned metal 6 thereover. If removing uncovered portions 7 of the thin metal film 3 is desired, a process similar to that described in FIG. 3A is used to remove the portions 7 of thin metal film 3 that remains exposed after the patterned metal layer 6 is deposited over the thin metal film. According to this embodiment, patterned thin metal film and patterned metal 6 remain over the layer 11 over the substrate 4, as depicted in FIG. 8B. If a TFT transistor is being formed, the layer 11 may be selected such that after uncovered portions 7 of the thin metal film 3 are removed, a source and drain is formed. For example, if the layer 11 is made of CuPC, perylene or pentacene, for example, a TFT transistor may be formed without progressing through any of the optional steps set forth in the descriptions of FIGS. 9–11.

FIG. 9A shows a cross section of the substrate 4 of FIG. 8B having a layer 11, the patterned thin metal film and patterned metal thereover. Depending on the type of device being made, it may be further desired to remove the portions of the layer 11 that are not covered 12 by the patterned metal 6. For example, in order for the substrate to be patterned in this embodiment, the uncovered portions 12 of the layer 11 must be removed before one can get to the substrate 4 to etch it. The removal of portions 12 of the layer 11 may be accomplished by any suitable technique that preferably does not extensively damage the device being formed or the etching mask being used. Preferably, the removal process should be chosen to minimize damage to the patterned metal layer 6 and the remaining portions of the thin metal layer or at least remove the desired portions of layer 11 prior to etching away all of the patterned metal 6.

The uncovered portions 12 of the layer 11 may be removed for example by etching to yield a substrate having the patterned layer 11, patterned thin metal film and patterned metal layer over the substrate, as depicted in FIG. 9B. Preferably, reactive ion etching is used to remove portions 12. Reactive ion etching with a combination of $CF_4$ and $O_2$ or with $O_2$ may be used. A combination of $CF_4$ and $O_2$ is preferable when portions 12 include Alq3, which is rapidly removed by this combination. A thin protective layer of gold may be deposited as a part of the patterned metal layer to provide protection from the removal process, particularly if reactive ion etching with $CF_4$ and $O_2$ is used.

If a TFT transistor is being formed, and the layer 11 was not selected such that after uncovered portions 7 of the thin metal film 3 are removed, a source and drain is formed, a TFT transistor may be formed by filling in the space where the portions of layer 11 were removed with a suitable material for forming a source and drain. That is, the space may be filled with material such as CuPc, perylene or pentacene to form such a transistor.

FIG. 10A shows a cross-section of the substrate of FIG. 9B having the patterned organic layer, patterned thin metal film and patterned metal thereover. According to one embodiment of the present invention, if desired, the substrate may then be patterned, for example, by anisotropic etching the portions of the substrate 8 that are not covered by the patterned metal, to yield the patterned substrate depicted in FIG. 10B. The pattern of the patterned substrate essentially corresponds to the pattern of the die 1 that was used to transfer the metal over the substrate.

According to a further embodiment of the present invention, if desired, the patterned layers over the patterned substrate as depicted in FIG. 11A may then be removed from the substrate to yield an uncovered patterned substrate 9 as depicted in FIG. 11B. Such layers may be removed for example by use of a suitable wet chemical depending on the composition of the layers that are being removed.

The die should be properly positioned during the stamping process. In particular, the die should be positioned accurately with respect to features already over the substrate 4 during the stamping illustrated for example, in FIGS. 1 and 2 and FIGS. 6 and 7. This alignment may be achieved using techniques know to the art, such as optical alignment using IR light projected through the bottom of the substrate 4, fiducial alignment using light scattering, and any other suitable technique.

Although various embodiments of the invention are illustrated with simplified organic layers and metal layers, additional layers and sublayers may be present. For example, layers between the substrate and the thin metal film (e.g., the layer 11 depicted in FIG. 6) may include multiple sublayers. Additional layers may also be present between the substrate and the thin metal film. For example, an electrode may be positioned between the substrate 4 and the layer 11. Additional organic layers, such as a hole injecting layer may also be present, such as described in U.S. Pat. No. 5,998,803 to Forrest et al., which is incorporated by reference. Additional layers as known to the art may also be present.

Devices fabricated in accordance with the present invention may be incorporated into a wide variety of products. For example, an array of organic light emitting devices (OLEDs), fabricated using the method of the present invention to deposit electrical contacts of the OLED, may form a display. Such a display may be incorporated into other products, such as a vehicle, a television, a computer, a printer, a screen, a sign, a telecommunications device or a telephone, in a manner known to one of skill in the art.

OLEDs fabricated in accordance with the present invention may also be used for applications other than displays. For example, a line of such OLEDs could be incorporated into a printer, and used to generate images, in a manner known to one of skill in the art.

The present invention may also be used to fabricate a wide variety of devices in addition to OLEDs. For example, the present methods may be used to fabricate thin film transistors and other devices in which a high resolution is desired.

This invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

EXAMPLE

A method according to the present invention for the direct patterning of metal over a substrate by stamping was performed. Specifically a patterned metal layer was deposited over a substrate by pressing a metal covered die onto an unpatterned thin metal layer with enough pressure so as to cold-weld the metal on the protruding portions of the die to portions of the thin metal film with which the metal formed contact. When the die was removed, the portions of the metal layer cold-welded to the thin metal layer over the substrate detached from the die and remained cold-welded to the thin metal film over the substrate in essentially the same pattern as the die.

In the present example, a patterning process as shown in FIGS. 6 and 7 was used. A silicon die was patterned using lithography using a phase mask and reactive ion etching. A thin (about 50 Å thick) layer of Alq3 was deposited on the silicon stamp using thermal evaporation. An about 200 Å thick layer of gold was then deposited over the Alq3 layer using e-beam evaporation.

A silicon substrate was also formed. An about 200 nm thick polymer layer (photoresist) was deposited over the substrate using spin coating. A thin (about 50 Å thick) gold metal film was deposited over the polymer layer using thermal evaporation.

The silicon die was pressed onto the gold thin metal film such that the portions of the thick gold layer over the raised portions of the silicon die contacted portions of the thin gold metal film. Sufficient pressure was applied to the die, such that the portions that the portions of the thick gold metal layer over the die that contacted portions of the thin gold metal film cold-welded to the thin gold metal film.

The silicon die was then removed and the portions of the thick gold metal layer from over the die that cold-welded to the thin gold metal film remained cold-welded and broke away from the die, leaving a patterned gold layer over the substrate.

After the patterned gold layer was deposited over a substrate as set forth above, in accordance with the present invention, scanning electron microscope images were taken of the resulting patterned metal to show the accuracy with which layers of metal may be patterned in accordance with the methods of the present invention. The SEM images are shown in FIGS. 12–16.

The lighter gray lines in the images are the metal lines transferred from the die in the above described example.

The closeness of the lines in FIGS. 12–16 demonstrate the successful accurate patterning of metal over a substrate using the methods of the present invention.

Figure 16:
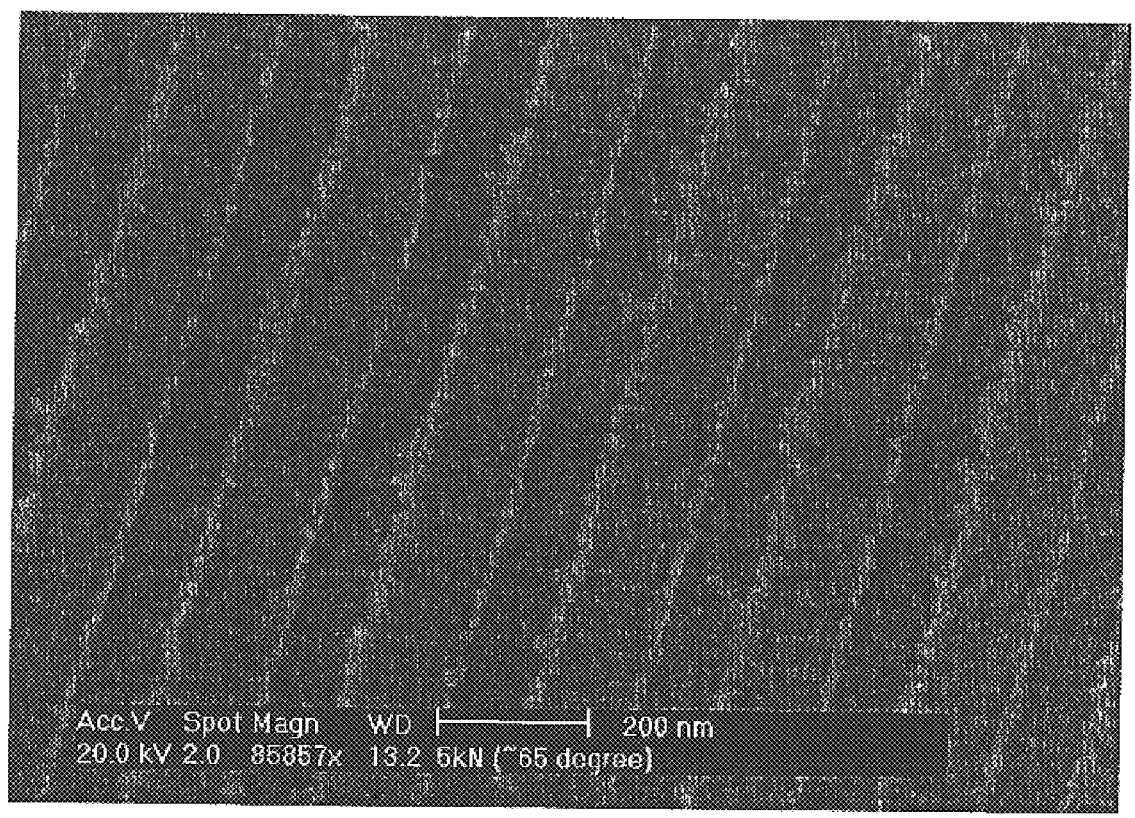
FIG. 16 shows SEM images of the sample of patterned metal of FIG. 12 at about a 65 degree angle.

The small wing tips on the metal lines of FIGS. 15 and 16 are likely a result of side wall deposition of metal on the stamp. In order to avoid such side wall deposition, a different shaped stamp may be used. For example, the preferred stamp shape shown in FIG. 17 may be used to avoid the wing tips. Most preferably the stamp has sharp edges to avoid side wall deposition of metal on the stamp.

The method of the present invention has several advantages over previously reported patterning techniques. For example, the present method is very cost-effective, because the dies are reusable. Preferably, any metal remaining on the die is left on the die and additional new metal may be added to the die as desired or needed. Alternatively, if removal of any metal remaining on the die is desired, such metal may be removed by methods known to those skilled in the art. The metal may be removed for example, by wet etching.

The methods of the present invention are also advantageous over previously reported patterning techniques because the present invention offers high throughput. Large areas, such as display panels, can be patterned in one step.

Additionally, the method of the present invention is well suited for roll-to-roll fabrication processes that use flexible plastic substrates. By using roller dies, large area patterning can be performed more easily for flexible substrates, since optimum pressure can be applied with smaller forces due to decreased contact areas. The method of the present invention allows simple, cost-effective and high throughput fabrication of OLEDs and other electronic devices and can be applied to the fabrication of flat panel displays, for example.

While the present invention is described with respect to particular examples and preferred embodiments, it is understood that the present invention is not limited to these examples and embodiments. In particular, the present invention is not limited to OLEDs, or thin film transistors and may be applied to a wide variety of electronic devices. In particular, the present invention may be used in forming any device in which a patterned metal layer is used in the device itself or in the formation of the device, for example as an etching mask in patterning other layers or the substrate. The present invention is not limited to the particular examples and embodiments described. The present invention as claimed therefore includes variations from the particular examples and preferred embodiments described herein, as will be apparent to one of skill in the art.

What is claimed is:

1. A method, comprising:
   depositing a thin metal film over a substrate;
   pressing a patterned die having at least one raised portion and having a metal layer thereover, onto the thin metal film, such that the metal layer over the raised portion of the patterned die contacts portions of the thin metal film over said substrate, and applying sufficient pressure such that the metal layer cold-welds to the thin metal film; and
   removing the patterned die, such that the metal layer cold-welded to portions of the thin metal film with which it has contact, detaches from said die and remains in contact with the thin metal film over said substrate in substantially the same pattern as the at least one raised portion of the die, thereby forming a patterned metal layer over said substrate.

2. The method of claim 1, wherein an adhesion-diminishing layer is positioned between the metal layer and the at least one raised portion of said patterned die.

3. The method of claim 2, wherein the strength of adhesion between said organic layer and said thin metal film is greater than the strength of adhesion between said metal layer and said adhesion-diminishing layer.

4. The method of claim 1, wherein a thin organic layer is positioned between the metal layer and the at least one raised portion of said patterned die.

5. The method of claim 4, wherein said thin organic layer is between about 25 and about 100 angstroms thick.

6. The method of claim 4, wherein said thin organic layer is about 50 angstroms thick.

7. The method of claim 4, wherein said thin organic layer comprises Alq3.

8. The method of claim 1, wherein a TEFLON layer is positioned between the metal layer and the at least one raised portion of said patterned die.

9. The method of claim 1, further comprising removing portions of the thin metal film that are not covered by said patterned metal layer after said patterned metal layer is formed over said substrate.

10. The method of claim 9, wherein the portions of the thin metal film that are not covered by the patterned metal layer are removed by sputtering.

11. The method of claim 9, further comprising after removing portions of the thin metal film that are not covered by said patterned metal layer, anisotropic etching the portions of said substrate that are not covered by said patterned metal layer, to form a patterned substrate.

12. The method of claim 11, further comprising removing the patterned metal layer and the remaining portions of the thin metal film from said patterned substrate.

13. The method of claim 1, wherein an organic layer is deposited over said substrate and said thin metal film is deposited over said organic layer.

14. The method of claim 13, wherein said organic layer is a polymer layer.

15. The method of claim 13, further comprising removing portions of the thin metal film that are not covered by said patterned metal layer, and subsequently removing portions of the organic layer that are not covered by said patterned metal layer.

16. The method of claim 15, further comprising anisotropic etching the portions of said substrate that are not covered by said patterned metal layer, to form a patterned substrate.

17. The method of claim 16, further comprising removing the patterned metal layer and the remaining portions of the thin metal film and the organic layer from said patterned substrate.

18. The method of claim 15, wherein the portions of the thin metal film that are not covered by the patterned metal layer are removed by sputtering.

19. The method of claim 15, wherein the portions of the organic layer that are not covered by the patterned metal layer are removed by reactive ion etching.

20. The method of claim 15, wherein the portions of the organic layer that are not covered by the patterned metal layer are removed by reactive ion etching with a combination of $CF_4$ and $O_2$.

21. The method of claim 15, wherein the portions of the organic layer that are not covered by the patterned metal layer are removed by reactive ion etching with $O_2$.

22. The method of claim 1, wherein an adhesion-enhancing layer is deposited over said substrate and said thin metal film is deposited over said adhesion-enhancing layer.

23. The method of claim 22, further comprising removing portions of the thin metal film that are not covered by said patterned metal layer, and subsequently removing portions of the adhesion-enhancing layer that are not covered by said patterned metal layer.

24. The method of claim 1, wherein the patterned die comprises a material selected from the group consisting of silicon, glass, quartz, steel and hard metals.

25. The method of claim 1, wherein the patterned die comprises silicon.

26. The method of claim 1, wherein the patterned die comprises a non-rigid material.

27. The method of claim 1, wherein the metal layer comprises a non-reactive metal.

28. The method of claim 1, wherein the metal layer comprises at least one metal selected from the group consisting of gold and silver.

29. The method of claim 1, wherein the thin metal film comprises a non-reactive metal.

30. The method of claim 1, wherein the thin metal film comprises at least one metal selected from the group consisting of gold and silver.

31. The method of claim 1, wherein the metal layer and the thin metal film comprise the same metal.

32. The method of claim 1, wherein the metal layer and the thin metal film comprise different metals.

33. The method of claim 1, wherein the metal layer comprises at least two layers of metal.

34. The method of claim 1, wherein the patterned metal layer over said substrate has a resolution of about 30 nm.

35. The method of claim 1, wherein said substrate comprises a material selected from the group consisting of polymers, glass and plexiglass.

36. The method of claim 1, wherein said substrate comprises glass.

37. The method of claim 1, wherein said substrate comprises plastic.

38. The method of claim 1, wherein the patterned metal layer over said substrate is an electrode.

39. The method of claim 1, wherein the patterned metal layer over said substrate is an etching mask.

40. A method of patterning a substrate comprising:

depositing an organic layer over a substrate;

depositing a thin metal film over the organic layer;

pressing a patterned die having at least one raised portion and having a metal layer thereover, onto the thin metal film, such that the metal layer over the raised portion of the patterned die contacts portions of the thin metal film over said substrate, and applying sufficient pressure such that the metal layer cold-welds to the thin metal film;

removing the patterned die, such that the metal layer cold-welded to portions of the thin metal film with which it has contact, detaches from said patterned die and remains in contact with the thin metal film over said substrate in substantially the same pattern as the at least one raised portion of the die, thereby forming a patterned metal layer over said substrate;

removing portions of the thin metal film that are not covered by said patterned metal layer;

removing portions of the organic layer that are not covered by said patterned metal layer;

anisotropic etching the portions of said substrate that are not covered by said patterned metal layer, thereby forming a patterned substrate; and removing the patterned metal layer and the remaining portions of the thin metal film and the organic layer from said patterned substrate.

41. The method of claim 40, wherein an adhesion-diminishing layer is positioned between the metal layer and the at least one raised portion of said patterned die.

42. The method of claim 41, wherein the strength of adhesion between said organic layer and said thin metal film is greater than the strength of adhesion between said metal layer and said adhesion-diminishing layer.

43. The method of claim 40, wherein a thin organic layer is positioned between the metal layer and the at least one raised portion of said patterned die.

44. The method of claim 43, wherein said thin organic layer is between about 25 and about 100 angstroms thick.

45. The method of claim 43, wherein said thin organic layer is about 50 angstroms thick.

46. The method of claim 43, wherein said thin organic layer comprises Alq3.

47. The method of claim 40, wherein a TEFLON layer is positioned between the metal layer and the at least one raised portion of said patterned die.

48. The method of claim 40, wherein said organic layer over said substrate is a polymer layer.

49. The method of claim 40, wherein the portions of the thin metal film that are not covered by the patterned metal layer are removed by sputtering.

50. The method of claim 40, wherein the portions of the organic layer that are not covered by the patterned metal layer are removed by reactive ion etching.

51. The method of claim 40, wherein the portions of the organic layer that are not covered by the patterned metal layer are removed by reactive ion etching with a combination of $CF_4$ and $O_2$.

52. The method of claim 40, wherein the portions of the organic layer that are not covered by the patterned metal layer are removed by reactive ion etching with $O_2$.

53. The method of claim 40, wherein the patterned die comprises a material selected from the group consisting of silicon, glass, quartz, steel, and hard metals.

54. The method of claim 40, wherein the patterned die comprises silicon.

55. The method of claim 40, wherein the patterned die comprises a non-rigid material.

56. The method of claim 40, wherein the metal layer comprises a non-reactive metal.

57. The method of claim 40, wherein the metal layer comprises at least one metal selected from the group consisting of gold and silver.

58. The method of claim 40, wherein the thin metal film comprises a non-reactive metal.

59. The method of claim 40, wherein the thin metal film comprises at least one metal selected from the group consisting of gold and silver.

60. The method of claim 40, wherein the metal layer and the thin metal film comprise the same metal.

61. The method of claim 40, wherein the metal layer and the thin metal film comprise different metals.

62. The method of claim 40, wherein the metal layer comprises at least two layers of metal.

63. The method of claim 40, wherein the patterned substrate has a resolution of about 30 nm.

64. The method of claim 40, wherein said substrate comprises a material selected from the group consisting of polymers, glass and plexiglass.

65. The method of claim 40, wherein said substrate comprises glass.

66. The method of claim 40, wherein said substrate comprises plastic.

* * * * *